(12) United States Patent
Ferrario et al.

(10) Patent No.: US 8,832,392 B2
(45) Date of Patent: *Sep. 9, 2014

(54) INDEXED REGISTER ACCESS FOR MEMORY DEVICE

(71) Applicant: Micron Technology, Inc., Boise, ID (US)

(72) Inventors: Marco Ferrario, Milan (IT); Daniele Balluchi, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/027,088

(22) Filed: Sep. 13, 2013

(65) Prior Publication Data

US 2014/0019702 A1    Jan. 16, 2014

Related U.S. Application Data

(63) Continuation of application No. 12/916,421, filed on Oct. 29, 2010, now Pat. No. 8,539,189.

(30) Foreign Application Priority Data

Apr. 30, 2010    (IT) .............................. MI2010A0761

(51) Int. Cl.
*G06F 12/00* (2006.01)
*G06F 13/00* (2006.01)
*G06F 13/28* (2006.01)
*G11C 7/10* (2006.01)
*G06F 12/02* (2006.01)

(52) U.S. Cl.
CPC .............. *G06F 12/02* (2013.01); *G11C 7/1078* (2013.01); *G11C 7/1087* (2013.01); *G11C 7/1093* (2013.01); *G11C 7/1051* (2013.01); *G11C 7/1066* (2013.01); *G11C 7/106* (2013.01)
USPC ........................... 711/154; 711/103; 711/167

(58) Field of Classification Search
CPC .. G06F 12/02; G06F 9/30101; G06F 13/1689
USPC ........................................ 711/103, 154, 163
See application file for complete search history.

(56) References Cited

U.S. PATENT DOCUMENTS

2005/0256993 A1    11/2005    Chalopin et al.
2006/0075395 A1    4/2006    Lee et al.

(Continued)

FOREIGN PATENT DOCUMENTS

CN        101361038        2/2009
JP        2003-242470      8/2003

(Continued)

OTHER PUBLICATIONS

Decision of Rejection dated Sep. 3, 2013 in corresponding Japanese Patent Application No. 2011-102875.

(Continued)

*Primary Examiner* — Ryan Bertram
(74) *Attorney, Agent, or Firm* — Knobbe, Martens, Olson & Bear LLP

(57) ABSTRACT

Example embodiments of a non-volatile memory device may comprise receiving an index value at one or more input terminals of a memory device and storing the index value in a first register of the memory device. The first register may be implemented in a first clock domain, and the index value may identify a second register of the memory device implemented in a second clock domain.

21 Claims, 5 Drawing Sheets

(56) References Cited

U.S. PATENT DOCUMENTS

| | | |
|---|---|---|
| 2006/0224800 A1 | 10/2006 | Tashiro |
| 2007/0124566 A1 | 5/2007 | Cohen |

FOREIGN PATENT DOCUMENTS

| | | |
|---|---|---|
| JP | 2003-242474 | 8/2003 |
| JP | 2009-517742 | 4/2009 |
| JP | 2009-163758 | 7/2009 |

OTHER PUBLICATIONS

Office Action dated Aug. 22, 2013 for Chinese Patent Application 201110115893.0.

Notice of Rejection dated Mar. 19, 2013 for Japanese Patent Application 2011-102875.

Preliminary Rejection for Korean Patent Application 10-2011-41698 dated Oct. 30, 2012.

Office Action, and its English translation, dated Jan. 9, 2014 in corresponding ROC Taiwanese Patent Application No. 100115189.

Search Report, and its English translation, dated Jan. 6, 2014 in corresponding ROC Taiwanese Patent Application No. 100115189.

INDEXED REGISTER ACCESS FOR MEMORY DEVICE

This application is a continuation of U.S. patent application Ser. No. 12/916,421, filed Oct. 29, 2010, which claims priority to the Italian Patent Application No. MI2010A000761, filed Apr. 30, 2010, now Italian Patent No. 1,399,916, the disclosures of each of which are incorporated herein by reference in their entireties.

BACKGROUND

1. Field

Subject matter disclosed herein may relate to accessing registers located in a memory device, and may relate more particularly to indexed register access for registers in a memory device.

2. Description of the Related Art

Memory devices, including non-volatile memory device types such as flash memory devices, may be found in a wide range of electronic devices. In particular, flash memory devices may be used in computers, digital cameras, cellular telephones, personal digital assistants, etc. Memory devices may include one or more registers for storing various types of information. Registers may be implemented in a relatively fast clock domain on a memory device, such as a clock domain shared by a memory device's serial or parallel input/output interface, for example.

BRIEF DESCRIPTION OF THE DRAWINGS

Claimed subject matter is particularly pointed out and distinctly claimed in the concluding portion of the specification. However, both as to organization or method of operation, together with objects, features, or advantages thereof, it may best be understood by reference to the following detailed description if read with the accompanying drawings in which:

DETAILED DESCRIPTION

Figure 1:
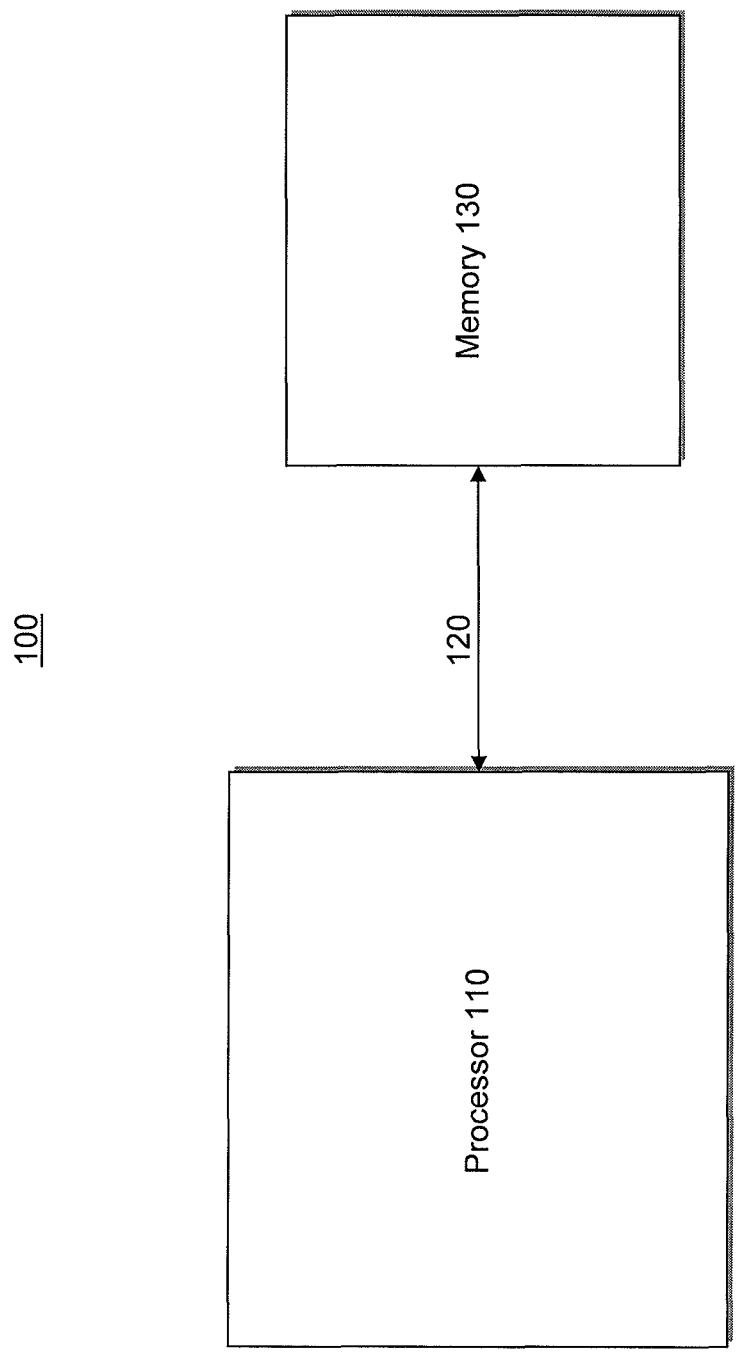
FIG. 1 is a schematic block diagram illustrating an example embodiment of a computing platform.

Reference is made in the following detailed description to the accompanying drawings, which form a part hereof, wherein like numerals may designate like parts throughout to indicate corresponding or analogous elements. It will be appreciated that for simplicity or clarity of illustration, elements illustrated in the figures have not necessarily been drawn to scale. For example, dimensions of some elements may be exaggerated relative to other elements for clarity. Further, it is to be understood that other embodiments may be utilized. Furthermore, structural or logical changes may be made without departing from the scope of claimed subject matter. It should also be noted that directions or references, for example, up, down, top, bottom, and so on, may be used to facilitate discussion of the drawings and are not intended to restrict application of claimed subject matter. Therefore, the following detailed description is not to be taken to limit the scope of claimed subject matter or their equivalents.

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

As discussed above, memory devices, including non-volatile memory device types, such as flash memory devices, may be found in a wide range of electronic devices. Memory devices, such as flash memory devices, to name merely a single example memory type, may be used in computers, digital cameras, cellular telephones, personal digital assistants, etc. Memory devices may include one or more registers for storing various types of information. Registers may be implemented in a relatively high frequency clock domain on a memory device. For example, one or more registers may be implemented in a clock domain shared by a serial or parallel input/output interface of a memory device. However, to incorporate increasingly larger numbers of registers in a memory device, design or manufacturing challenges may arise in implementing registers in a relatively high frequency clock domain. To incorporate larger numbers of registers in a memory device while avoiding or reducing at least some challenges that may be associated with registers implemented in a relatively high frequency clock domain, embodiments in accordance with claimed subject matter may utilize an indexed register scheme. Example embodiments of indexed register schemes are described herein.

To access arbitrarily large counts of registers in a memory device while reducing difficulties in implementing registers in a relatively high frequency clock domain, an indexed register technique may be employed, in one or more embodiments. Example memory devices supporting indexed register access techniques may utilize one or more registers implemented in a relatively high frequency clock domain. One or more relatively high frequency clock domain registers may provide access to one or more additional registers implemented in a relatively low frequency clock domain. As used herein, a "relatively high frequency" clock domain may be referred to as a "fast" clock domain, and a "relatively low frequency" clock domain may be referred to as a "slow" clock domain. A first clock domain may be considered to be a "fast" clock domain and a second clock domain may be considered to be a "slow" clock domain if a first clock domain clock frequency is greater than a second clock domain clock frequency, even if a difference between clock frequencies is relatively small. In an embodiment, a fast clock domain may operate at approximately 400 MHz, and a slow clock domain may operate at approximately 50 MHz. However, these are merely example clock frequencies, and claimed subject matter is not limited in scope in these respects. In memory devices implementing an embodiment of an indexed register access scheme, it may be possible to write signals representative of data signals or information to a first register in a fast clock domain and to subsequently transfer information stored in the first register to a second register in a slow clock domain. In another embodiment, a plurality of registers may be implemented in a slow clock domain, and the first register of the fast clock domain may be utilized to access any of a plurality of registers of the slow clock domain.

One potential advantage of utilizing one or more registers of a fast clock domain to access one or more registers of a slow clock domain may be reducing design complexity or manufacturing costs if implementing increasingly large numbers of registers that may be used for any of a wide range of potential purposes. Implementing larger numbers of registers in a fast clock domain may present design challenges or may result in increased manufacturing difficulties or costs. Design challenges or manufacturing issues may be avoided or reduced, at least in part, by implementing a relatively small number of registers in a fast clock domain and implementing a larger number of registers in a slow clock domain. By implementing a few registers in a fast clock domain, performance considerations may be satisfied, and by implementing additional registers in a slow clock domain, larger numbers of registers may be provided while avoiding or reducing issues that may otherwise be encountered if larger numbers of registers were to be implemented in a fast clock domain. Of course, claimed subject matter is not limited in scope in this respect.

FIG. 1 is a block diagram of an example embodiment of a computing platform 100, comprising a processor 110 and a memory 130. For the present example, memory 130 comprises a flash memory device, although the scope of claimed subject matter is not limited in this respect. Memory 130 for this example is coupled to processor 110 by way of a parallel interconnect 120, although the scope of claimed subject matter is not limited in this respect. Further, in an embodiment, memory 130 may comprise one or more registers implemented in a first clock domain, and one or more additional registers implemented in a second clock domain. In an embodiment, one or more registers from the first clock domain may be utilized to access one or more registers of the second clock domain. Also, for an embodiment, the first clock domain may comprise a relatively high frequency clock domain, and the second clock domain may comprise a relatively low frequency clock domain. Embodiments in accordance with claimed subject matter are not limited to particular clock frequencies, but rather clock domains may have any of a very wide range of possible clock frequencies.

For an embodiment, a configuration of computing platform 100 may comprise an execute-in-place (XiP) implementation, such as depicted in FIG. 1, wherein processor 110 may fetch instructions directly from long-term memory. As used herein, the term "execute-in-place", along with its abbreviation "XiP", relates to a processor capable of fetching instructions from a long term storage device, such as, for example, a flash memory. More typically, processors fetch instructions from an intermediate storage, such as, for example, a dynamic random access memory (DRAM).

The term "computing platform" as used herein refers to a system or a device that includes an ability to process or store data in the form of signals. Thus, a computing platform, in this context, may comprise hardware, software, firmware or any combination thereof. Some portions of the detailed description included herein are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Computing platform 100, as depicted in FIG. 1, is merely one example, and the scope of claimed subject matter is not limited in these respects. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process as described herein, with reference to flow diagrams or otherwise, may also be executed or controlled, in whole or in part, by a computing platform. For example embodiments described herein, computing platform 100 may comprise a cellular telephone or smartphone, although again, the scope of claimed subject matter is not so limited.

As mentioned above, for an embodiment, processor 110 may be coupled to memory 130 by way of a parallel interconnect 120. In another example embodiment, interconnect 120 may comprise a serial peripheral interface (SPI). The scope of claimed subject matter is not limited to any particular type of interconnect between a processor and a memory device. Also, although processor 110 is depicted as being directly connected with memory 130, other embodiments within the scope of claimed subject matter may indirectly couple processor 110 with memory 130.

As previously mentioned, memory 130 may comprise a flash memory device, for one example embodiment. Flash memory may be characterized at least in part by an ability to be electrically erasable or programmable, and may be utilized in a wide range of electronic device types, including, but not limited to, digital cameras, cellular telephones, personal digital assistants, portable navigation devices, portable music players, notebook computers, desktop computers, etc., to name but a few examples. Also, flash memory devices may comprise parallel data interfaces or serial interfaces. Parallel interfaces, in at least some instances, may allow for relatively good data throughput due at least in part to increased numbers of input/output terminals. Serial interfaces, on the other hand, may provide reduced costs due at least in part to reduced numbers of input/output terminals. Of course, claimed subject matter is not limited in scope in these respects.

Although example embodiments described herein discuss memory as comprising flash memory devices, the scope of claimed subject matter is not limited in this respect and other embodiments may utilize other types of volatile or non-volatile memory devices. For example, one or more embodiments may include read-only memory (ROM), phase change memory (PCM), dynamic random access memory (DRAM), etc. Also, the scope of claimed subject matter is not limited to a particular type of flash memory. Embodiments in accordance with claimed subject matter may comprise NOR flash memory, to name but one example.

According to an embodiment, one or more registers of a memory device may store signals representative of data or information as expressed by a particular state of the memory device. For example, an electronic signal representative of data or information may be "stored" in a register in a memory device by affecting or changing a state of registers of the memory device to represent data or information as binary information (e.g., ones or zeros, individually referred to herein as "1" or "0"). In a particular implementation, for example, a change of state of register to store a signal representative of data or information may constitute a transformation of a memory device to a different state or thing.

Figure 2:
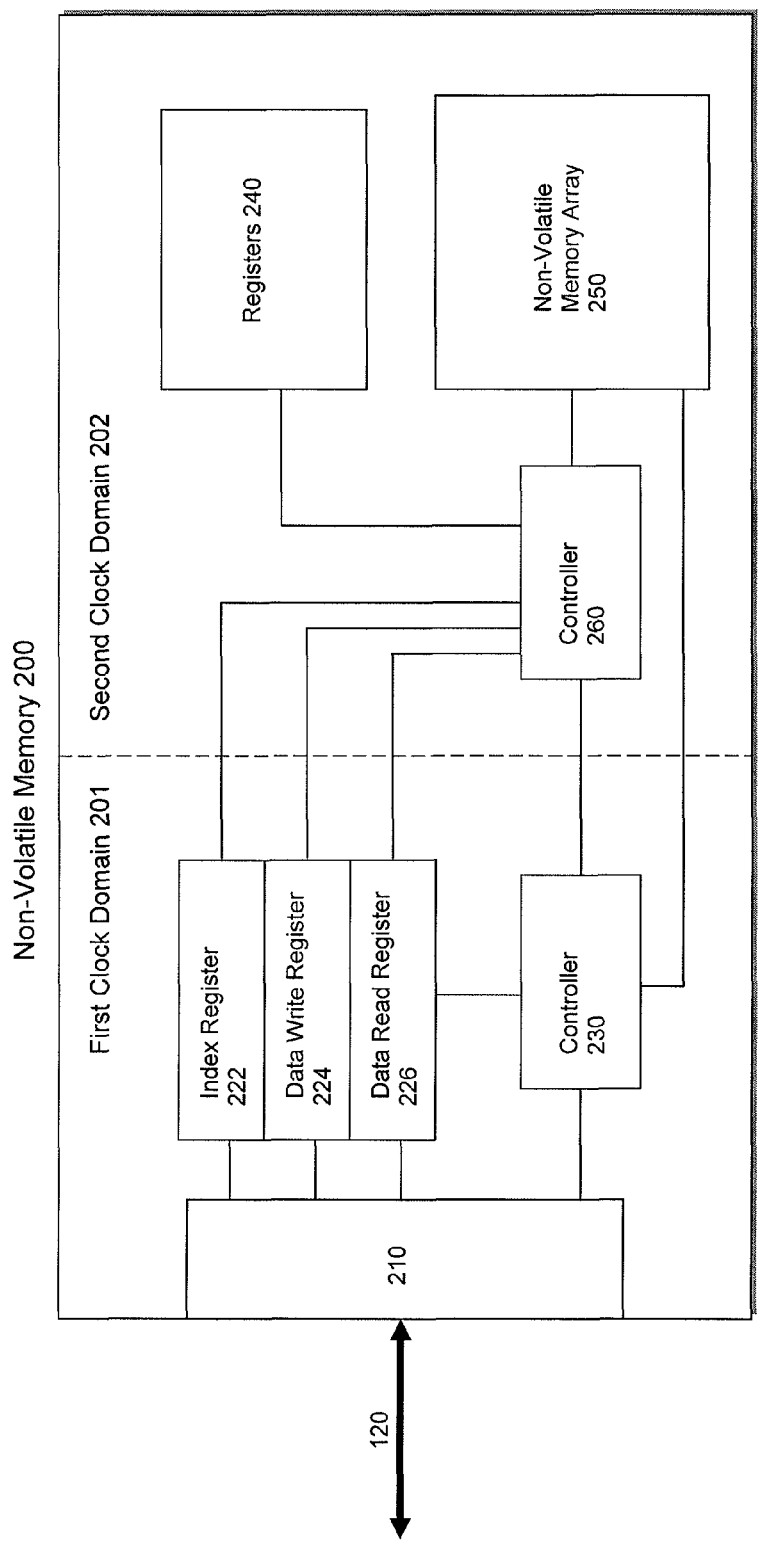
FIG. 2 is a schematic block diagram depicting an example embodiment of a non-volatile memory device.

FIG. 2 is a schematic block diagram depicting an example embodiment of a non-volatile memory device 200 including a non-volatile memory array 250. Memory device 200 may comprise a NOR flash memory device, although again, the scope of claimed subject matter is not limited in this respect. For one or more embodiments, non-volatile memory 200 may comprise a controller 230, a controller 260, and input/output buffers 210. Further, memory 200 for an embodiment may be partitioned into a first clock domain 201 and a second clock domain 202. For an embodiment, first clock domain 201 may comprise a fast clock domain and second clock domain 202 may comprise a slow clock domain. As mentioned previously, the labels of "fast" and "slow" do not denote any particular value or range of values for clock frequencies, but rather are meant to denote that first clock domain 201 operates at a higher clock frequency than second clock domain 202.

For one or more embodiments, controller 230 be located in first clock domain 201, and controller 260 may be located in second clock domain 202. In an embodiment, controller 230 may receive one or more control signals from processor 110 and may generate one or more internal control signals to perform any of a number of operations, including read and/or write operations, by which processor 110 may access information or banks within memory array 250, for example. Also, controller 230 may further generate one or more internal control signals to perform accesses to one or more registers. In an embodiment, controller 230 may communicate with controller 260 to perform operations. As used herein, the term "controller" is meant to include any circuitry or logic involved in management or execution of command sequences as they relate to memory devices. Controller 230 or controller 260 may further individually comprise a processor that may execute instructions to accomplish any of a number of functions related to memory 200. In an embodiment, controller 260 may perform information transfers between registers 222, 224, and 226 and registers 240. Further, controller 260 may perform accesses to memory array 250. Of course, embodiments described herein for non-volatile memory 200 are merely examples, and claimed subject matter is not limited in scope in this respect.

Non-volatile memory 200 for this example embodiment may receive one or more address, data, or control signals from processor 110 over interconnect 120. As is explained in more detail below, processor 110, for example, may transmit one or more signals representing a memory access command to non-volatile memory 200. A memory access command may include an address delivered via interconnect 120 and received at input/output buffers 210. Processor 110 may execute a software agent of some kind that may request access to memory array 250. A software agent, for example, may be executed from instructions stored in a code bank of memory array 250. Processor 110 may fetch instructions for the software agent and may further execute the fetched instructions. One or more of the instructions from the software agent may comprise a request for a read or write access to a data or information bank area of memory array 250.

Also, for an embodiment, processor 110 may execute a software agent of some kind that may request access to an index register 222, a data or information write register 224, or a data or information read register 226 implemented in first clock domain 201. The software agent may further request access to a plurality of registers 240, implemented in second clock domain 202.

Figure 3:
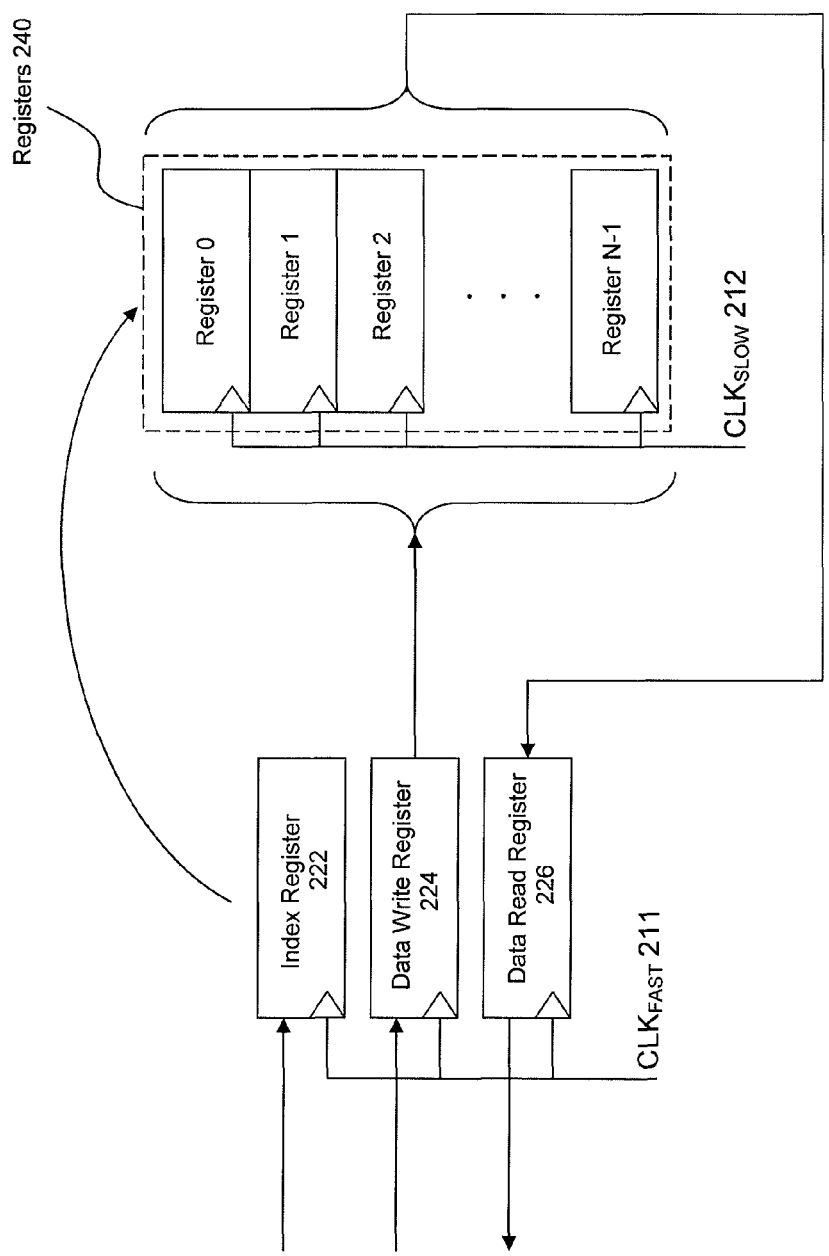
FIG. 3 is a schematic block diagram depicting an example embodiment of a register configuration for indexed register access for an example memory device.

FIG. 3 is a schematic block diagram depicting index register 222, data or information write register 224, and data or information read register 226 from memory 200. Also depicted in FIG. 3 are registers 240, numbered from 0 to N−1. As seen in FIG. 2, index register 222, write register 224, and read register 226 are part of first clock domain 201, and as such are clocked by a fast clock signal ($CLK_{FAST}$) 211. As mentioned previously, the term "fast" as used in connection with a clock domain or with a clock signal is not meant to denote any particular clock frequency or range of frequencies. Rather, the term "fast" is meant to merely denote that a fast clock domain or a fast clock signal has a clock frequency that is greater than that for a "slow" clock domain or a slow clock signal. Similarly, the term "slow" as used in connection with a clock signal or a clock domain is meant to merely denote that a slow clock domain or a slow clock signal has a clock frequency that is less than that for a fast clock domain or a fast clock signal. As further depicted in FIG. 2, registers 240 are part of second clock domain 202, and as such are clocked by a slow clock signal ($CLK_{SLOW}$) 212.

In an embodiment, one or more of registers 240 may be accessed, for example by processor 210, at least in part by writing an index value to index register 222. The index value may comprise a pointer to one or more of registers 240. For an embodiment, to access more than one of registers 240, index register 222 may be partitioned into more than one segment such that index register may store more than one index value that may serve as more than one pointer to respectively more than one of registers 240. However, claimed subject matter is not limited in scope in this respect.

For an example register write command, consider a situation where processor 110 performs a write access to Register 2 of registers 240. Processor 110 may write information destined for Register 2 to write register 224 and may write an index value identifying Register 2 to index register 222. For an embodiment, controller 260 may transfer information stored in write register 224 to a register identified by the index value stored in index register 222, which, for the present example, is Register 2. In this manner, a write access to a register implemented in a slow clock domain (Register 2 in this example) may be accomplished by writing values to registers implemented in a fast clock domain (index register 222 and data write register 224 in this example). Performance criteria may be met by permitting register accesses to index and registers located in the fast clock domain, and larger numbers of registers may be supported by implementing those registers in the slower clock domain. Thus, potential benefits of fast register access and larger numbers of registers may be realized.

Similarly, for an example register read command, consider a situation where processor 110 performs a read access from Register 1 of registers 240. Processor 110 may write an index value identifying Register 1 to index register 222. As part of performing a read command issued by processor 110, controller 260 may transfer information stored in a register identified by an index value stored in index register 222, which in this example is Register 1, to read register 226, and signal information stored in read register 226 may be provided to processor 110. Of course, these are merely example register write or read accesses, and claimed subject matter is not limited in scope in this respect. Similarly, organization and configuration of registers depicted in FIG. 3 is merely an example, and again, claimed subject matter is not limited in scope in this respect.

Figure 4:
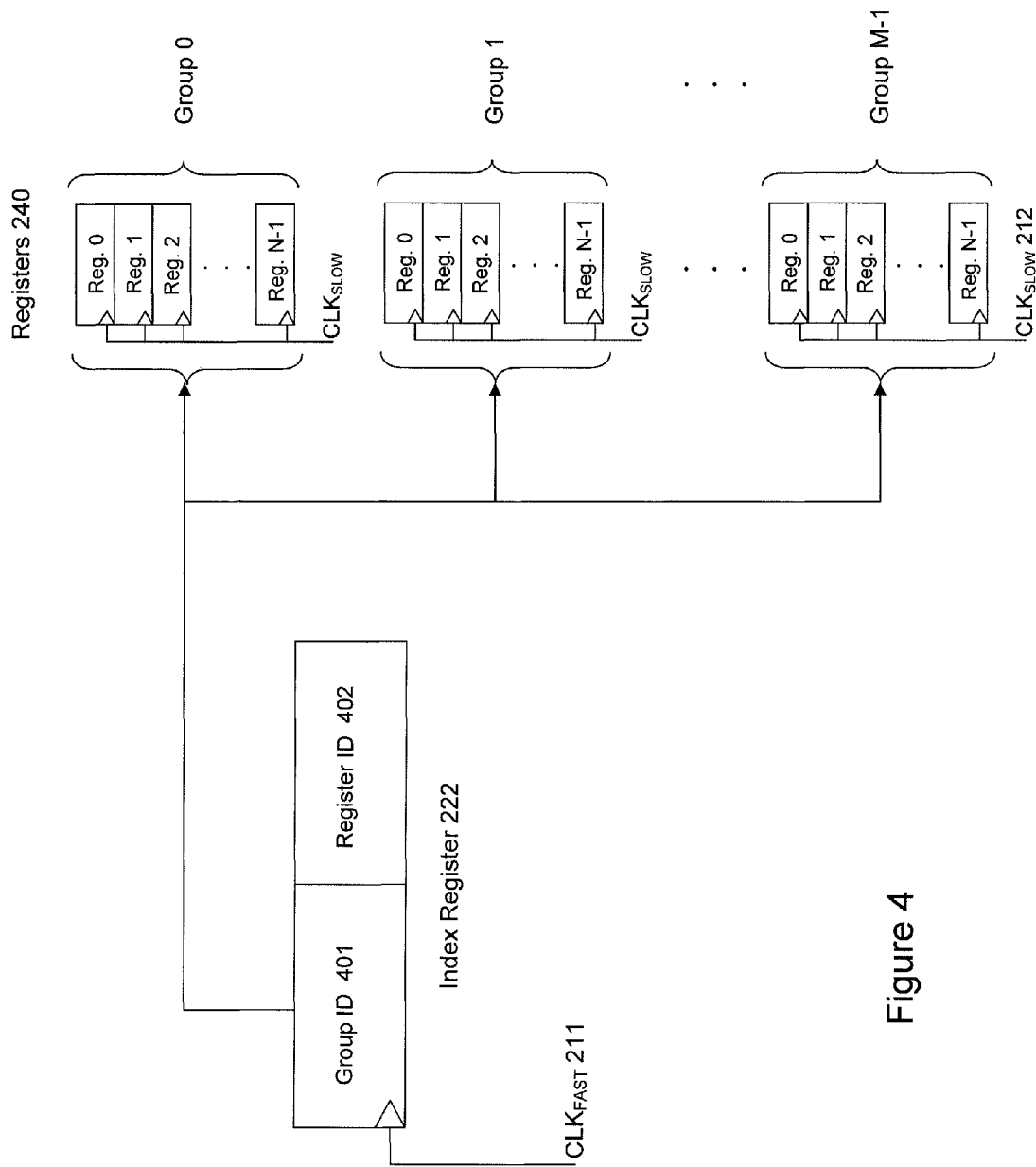
FIG. 4 is a schematic block diagram depicting an example embodiment of a register configuration for indexed register access for an example memory device.

FIG. 4 is a schematic block diagram depicting an example embodiment of a register configuration for indexed register access for example non-volatile memory device 200. The example of FIG. 4 differs from the example depicted in FIG. 3 in several ways. In FIG. 4, registers 240 are partitioned into M groups. In an embodiment, individual groups include N registers. However, although the example of FIG. 4 depicts equal counts of registers in M individual groups, claimed subject matter is not limited in scope in this respect. In one or more other embodiments, individual groups may include differing counts of registers. For example, group 1 may include three registers, and group 0 may include two registers. However, these are merely examples, and claimed subject matter is not limited in scope in this respect.

Also, for the example of FIG. 4, index register 222 may be partitioned into two fields. Embodiments in accordance with claimed subject matter may include one or more fields. In an embodiment, index register 222 may comprise a group identification (ID) field 401 and a register ID field 402. Group ID field 401 may store a group ID value to identify a group from among M groups of registers 240. Register ID field 402 for an embodiment may store a register ID value to identify a particular register within a group identified by a group ID field. Further, although the example of FIG. 4 depicts a single group ID field and a single register ID field, claimed subject matter is not limited in scope in this respect. Other embodiments of an index register in accordance with claimed subject matter may include more than one group ID field or more than one register ID field such that more than one group or more than one register may be identified by an index value stored in an index register, such as index register 222. Additionally, embodiments in accordance with claimed subject matter may include more than one index register. Further, other embodiments may incorporate additional types of fields to allow indexed register accesses to be used for a wide range of purposes.

In an embodiment, one or more groups of registers may be utilized in a security operation to define a block of protected memory. While various details of a memory protection scheme are well-known, an embodiment of an indexed register access scheme including write security register or read security register commands may play a role in providing one or more protected areas of memory. In an embodiment, an index register implemented in a fast clock domain may be partitioned into an identification field and a register type field. A security register may be implemented in a slow clock domain, for an embodiment. Also, for an embodiment, an index value may be partitioned into an identification value and a register type value, wherein the identification value may comprise a pointer to the security register. Additionally, for an embodiment, a write security register command or a read security register command may be performed. Information stored in a write data register implemented in a fast clock domain may be written to the security register at least in part in response to receiving a write security register command code, and information stored in the security register may be transferred to a read data register at least in part in response to receiving a read security register command code, for an embodiment. Further, for an embodiment, a security register may comprise a protected memory block register. However, claimed subject matter is not limited in scope in these respects.

Figure 5:
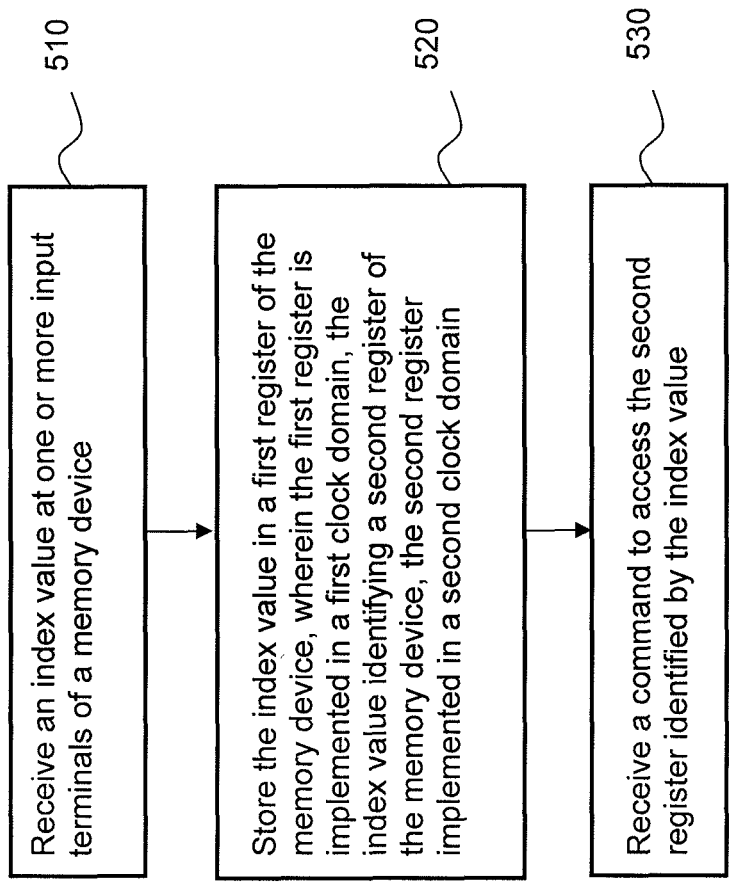
FIG. 5 is a flow diagram illustrating an example embodiment of a process for indexed register access for an example memory device.

FIG. 5 is a flow diagram illustrating an example embodiment of a process for indexed register access for an example memory device. At block 510, an index value may be received at one or more input terminals of a memory device. As used herein, the term "input terminal" is meant to include not only input-only terminals, but also input/output terminals. Also for an embodiment, a memory device may comprise a phase-change memory (PCM) flash memory device, although again, claimed subject matter is not limited in this respect. At block 520, an index value may be stored in a first register of the memory device. The first register may be implemented in a first clock domain. The index value may identify a second register of the memory device, wherein the second register is implemented in a second clock domain. In an embodiment, the first clock domain may operate at a higher clock frequency than a clock frequency for the second clock domain. In an embodiment, the second register may be access through the first register. Further, in an embodiment, the first register may store an index value that may point to the location of the second register. At block 530, a command to access the second register identified by the index value may be received. In this manner, from a system-level perspective, an access to the second register located in a slow clock domain operates in a similar fashion as an access to a register in a fast clock domain. Also, because a last value written to or read from a register in a slow clock domain may be stored in a write or a read register, debugging operations may be enhanced, for an embodiment. Embodiments in accordance with claimed subject matter may include all, fewer than, or more than blocks 510 through 530. Also, order of blocks 510 through 530 is merely an example order, and claimed subject matter is not limited in scope in this respect.

Some portions of the detailed description included herein are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

Likewise, the terms, "and" and "or" as used herein may include a variety of meanings that also is expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures or characteristics. Though, it should be noted that this is merely an illustrative example and claimed subject matter is not limited to this example.

In the preceding description, various aspects of claimed subject matter have been described. For purposes of explanation, systems or configurations were set forth to provide an understanding of claimed subject matter. However, claimed subject matter may be practiced without those specific details. In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

What is claimed is:

1. A memory device comprising:
a first partition configured to operate at a first clock frequency, the first partition comprising a first register configured to operate at the first clock frequency, wherein the first register is configured to communicatively couple to an input/output interface of the memory device; and
a second partition configured to operate at a second clock frequency lower than the first clock frequency, the second partition comprising a second register configured to operate at the second clock frequency, wherein the second register is configured to communicatively couple to the first register and configured to exchange data with the first register.

2. The memory device of claim 1, wherein the second partition further comprises a plurality of second registers configured to operate at the second clock frequency, wherein the first partition further comprises an index register, wherein the index register is configured to store an index value identifying one of the second registers.

3. The memory device of claim 2, wherein the first partition further comprises a first controller configured to operate at the first clock frequency and configured to access the second register identified by the index register in response to a read access signal or a write access signal.

4. The memory device of claim 3, wherein the first register comprises a write register and wherein the first partition further comprises a read register,
wherein the read register is configured to transfer read data to the input/output interface upon the first controller receiving the read access signal, and
wherein the write register is configured to receive write data from the input/output interface upon the first controller receiving the write access signal.

5. The memory device of claim 4, wherein the second partition further comprises a second controller configured to communicatively couple to the first, the read, the write, and the second registers, wherein the second controller is configured to transfer write data from the write register to one of second registers identified by one of the index registers, wherein the second controller is further configured to transfer read data from one of second registers identified by one of the index registers to the read register.

6. The memory device of claim 5, wherein a number of second registers in the second partition is greater than a number of registers in the first partition.

7. The memory device of claim 5, wherein the second partition further comprises a memory array configured to communicatively couple to the input/output interface though the second controller.

8. The memory device of claim 7, wherein the memory array comprises a nonvolatile memory array.

9. The memory device of claim 8, wherein the memory array comprises one of a flash memory array and a phase change memory array.

10. The memory device of claim 1, wherein the first clock frequency is at least about 5 times higher than the second clock frequency.

11. A computing platform comprising:
a processor;
a memory device configured to communicatively couple to the processor, the memory device comprising:
a first partition configured to operate at a first clock frequency, the first partition comprising a first register configured to operate at the first clock frequency, wherein the first register is configured to communicatively couple to the processor through an input/output interface of the memory device; and
a second partition configured to operate at a second clock frequency lower than the first clock frequency, the second partition comprising a second register configured to operate at the second clock frequency, wherein the second register is configured to communicatively couple to the first register and configured to exchange data with the first register.

12. The computing platform of claim 11, wherein the second partition further comprises a plurality of second registers configured to operate at the second clock frequency, wherein the first partition further comprises an index register, wherein the index register is configured to store an index value identifying one of the second registers.

13. The computing platform of claim 12, wherein the first partition further comprises a first controller configured to operate at the first clock frequency and configured to access the second register identified by the index register in response to a read access signal or a write access signal.

14. The computing platform of claim 13, wherein the first register comprises a write register and wherein the first partition further comprises a read register,
wherein the read register is configured to transfer read data to the processor through the input/output interface upon the first controller receiving the read access signal, and
wherein the write register is configured to receive write data from the input/output interface upon the first controller receiving the write access signal.

15. The computing platform of claim 13, wherein the second partition further comprises a second controller configured to communicatively couple to the first, the read, the write, and the second registers, wherein the second controller is configured to transfer write data from the write register to one of second registers identified by one of the index registers, wherein the second controller is further configured to transfer read data from one of second registers identified by one of the index registers to the read register.

16. The computing platform of claim 15, wherein the memory device comprises a nonvolatile memory.

17. The computing platform of claim 16, wherein the computing platform is configured in an execute-in-place configuration, wherein the processor is configured to fetch instructions directly from the memory device.

18. The computing platform of claim 17, wherein memory device further comprises a code bank, wherein the processor is configured to fetch instructions from the code bank.

19. The computing platform of claim 17, wherein the memory device comprises a NOR flash memory device.

20. The computing platform of claim 17, wherein the memory device comprises a phase change memory device.

21. The computing platform of claim 17, further comprising a dynamic random access memory device, wherein the processor is configured to fetch instructions from the memory device through the dynamic random access device.

\* \* \* \* \*